(12) United States Patent
Buenning et al.

(10) Patent No.: US 9,812,361 B2
(45) Date of Patent: Nov. 7, 2017

(54) COMBINATION GRINDING AFTER LASER (GAL) AND LASER ON-OFF FUNCTION TO INCREASE DIE STRENGTH

(71) Applicant: NXP B.V., Eindhoven (NL)

(72) Inventors: Hartmut Buenning, Hamburg (DE); Sascha Moeller, Hamburg (DE); Guido Albermann, Hamburg (DE); Martin Lapke, Hamburg (DE); Thomas Rohleder, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/204,858

(22) Filed: Mar. 11, 2014

(65) Prior Publication Data
US 2015/0069578 A1    Mar. 12, 2015

Related U.S. Application Data

(60) Provisional application No. 61/876,470, filed on Sep. 11, 2013.

(51) Int. Cl.
*H01L 21/78* (2006.01)
*H01L 21/683* (2006.01)
*H01L 21/784* (2006.01)
*H01L 21/268* (2006.01)

(52) U.S. Cl.
CPC ............ *H01L 21/78* (2013.01); *H01L 21/268* (2013.01); *H01L 21/6835* (2013.01); *H01L 21/784* (2013.01); *H01L 21/6836* (2013.01); *H01L 2221/6834* (2013.01); *H01L 2221/68327* (2013.01); *H01L 2221/68336* (2013.01)

(58) Field of Classification Search
CPC ... H01L 21/78; H01L 21/784; H01L 21/6835; H01L 21/6836; H01L 2221/68327; H01L 2221/68336; H01L 21/268; B23K 26/4075; B23K 26/367; B23K 26/0057
USPC ......... 257/620, 499, E21.237; 438/463, 462, 438/460
See application file for complete search history.

(56) References Cited

U.S. PATENT DOCUMENTS

| | | | |
|---|---|---|---|
| 8,258,046 B2 * | 9/2012 | Ueki | B23K 26/4075 156/248 |
| 2008/0035611 A1 * | 2/2008 | Kuno | C03B 33/0222 219/69.1 |

(Continued)

*Primary Examiner* — Michael Trinh

(57) ABSTRACT

Consistent with an example embodiment, there is a method for preparing integrated circuit (IC) device die from a wafer substrate having a front-side with active devices and a back-side. The method comprises pre-grinding the backside of a wafer substrate to a thickness. The front-side of the wafer is mounted onto a protective foil. A laser is applied to the backside of the wafer, at first focus depth to define a secondary modification zone in saw lanes. To the backside of the wafer, a second laser process is applied, at a second focus depth shallower than that of the first focus depth, in the saw lanes to define a main modification zone, the secondary modification defined at a pre-determined location within active device boundaries, the active device boundaries defining an active device area. The backside of the wafer is ground down to a depth so as to remove the main modification zone. The IC device die are separated from one another by stretching the protective foil.

15 Claims, 4 Drawing Sheets

(56) References Cited

U.S. PATENT DOCUMENTS

| | | | |
|---|---|---|---|
| 2010/0240159 A1* | 9/2010 | Kumagai | B23K 26/0057 438/33 |
| 2011/0000897 A1* | 1/2011 | Nakano | B23K 26/0057 219/121.72 |
| 2014/0145294 A1 | 5/2014 | Moeller et al. | |

* cited by examiner

COMBINATION GRINDING AFTER LASER (GAL) AND LASER ON-OFF FUNCTION TO INCREASE DIE STRENGTH

CROSS-REFERENCE TO RELATED APPLICATION

This application claims the benefit of U.S. Provisional Application No. 61/876,470 filed on Sep. 11, 2013 and is incorporated by reference in its entirety.

FIELD

The embodiments of the present invention relate to the preparing of semiconductor wafers having active device die so as to increase the yield of those device die when packaged, in particular device die packaged in radio frequency identification devices (RFID) tags.

BACKGROUND

Integrated circuits (ICs) are typically produced by forming a plurality of ICs on a semiconductor substrate, such as silicon. The ICs include one or more layers formed on the substrate (e.g., semiconductor layers, insulation layers, and metallization layers). The individual ICs are separated by lanes. The finished ICs on the wafer are then separated into individual ICs by, for instance, sawing the wafer along the lanes. Separation of the wafer into individual ICs may be referred to as dicing. Sawing may be performed using various mechanical cutting and laser cutting methods. Mechanical cutting tools tend to cause chipping of the back-side or front-side of a substrate. Laser cutting tends to cut unevenly in metallization layers covering entirely or partly the saw lanes of the substrate.

During a stealth laser dicing process, the laser focuses into the material and melts the mono-crystalline silicon. The material re-crystallizes as polycrystalline silicon, which induces stress into the material due to higher volume of the poly-crystalline structure. This stress creates a crack, which is used for die separation.

For one particular type of product, a radio frequency identification device (RFID) tags, the feature for the die separation, has become a challenge during the later RFID tag production process. Once the device die is embedded in a glue within the RFID tag, bending forces may be transferred from the die side into the laser modification zone (on the sidewalls of the embedded die) resulting in cracking at die edges.

There exists a need for to eliminate this shortcoming in the assembly of RFID devices.

SUMMARY

The present disclosure has been found useful in the packaging of semiconductor devices which find their way into RFID tags and the like. RFID tags and other smart card devices undergo mechanical stress during their lifetime. For example, putting an RFID-enabled card in one's pocket can exert stress on the packaging structures. Over time, the accumulated stress of bending and crushing wears out the package and one or more electrical/mechanical connections to the RFID are broken; the RFID equipped device no longer works.

In an example embodiment, there is a method for preparing integrated circuit (IC) device die from a wafer substrate having a front-side with active devices and a back-side. The method comprises pre-grinding the backside of a wafer substrate to a thickness. The front-side of the wafer is mounted onto a protective foil. At first focus depth, on the back-side of the wafer, a laser is applied at to define a secondary modification zone in saw lanes; the secondary modification zone is defined at a pre-determined location within active device boundaries, the active device boundaries defining an active device area. At a second focus depth shallower than that of the first focus depth, a laser is applied to the back-side of the wafer in the saw lanes to define a main modification zone. The back-side of the wafer is ground down to a depth so as to substantially remove the main modification zone. To separate IC device die from one another, the protective foil is stretched.

In another example embodiment, an integrated circuit (IC) wafer substrate has a front-side and a back-side. The IC wafer substrate comprises active devices on the front-side, each having active device boundaries, the active device boundaries defining an active device area. There is a secondary modification zone on the back-side of the wafer substrate, at first focus depth, in saw lanes between active devices and a main modification zone on the back-side of the wafer substrate, at a second focus depth shallower than that of the first focus depth; the secondary modification zone is at a location within the active device boundaries. To relieve stress at active device edges, the back-side of the wafer has been ground down to a depth in which substantially all of the main modification zone has been removed.

The above summaries of the present disclosure are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

Figure 1:
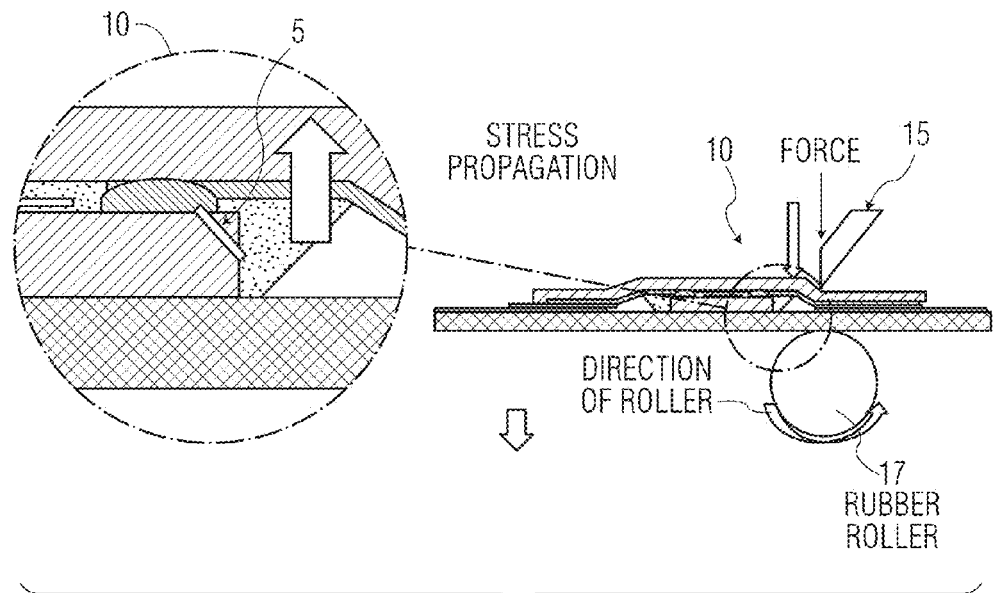
FIG. 1 illustrates the sources of stress in an IC device assembled in an RFID package.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The disclosed embodiments have been found useful in preventing damage to active device die prepared for packaging in RFID tags, and the like.

In an example, process, a "stealth dicing" process may be used for separating such a wafer into individual ICs. Channels are formed in the one or more metallization layers on a front-side of the wafer along respective lanes along which the ICs are to be separated. These (separation) lanes are located between ICs and extend between a front-side of the wafer at the metallization layer(s), and a backside of the wafer at the silicon substrate. After forming the channels, the backside of the silicon substrate is thinned, and laser pulses are applied via the backside of the silicon substrate to change the crystalline structure of the silicon substrate along the lanes. This change in the silicon structure weakens the silicon in the lanes. The changed portions (i.e., "modification zone") in the silicon substrate and the channels facilitate the propagation of cracks in the silicon substrate along the lanes during expansion of the wafer, while mitigating propagation of cracks outside of the lanes. With this approach, wafer separation can be achieved while mitigating issues that can arise from the formation of cracks.

Figure 2A:
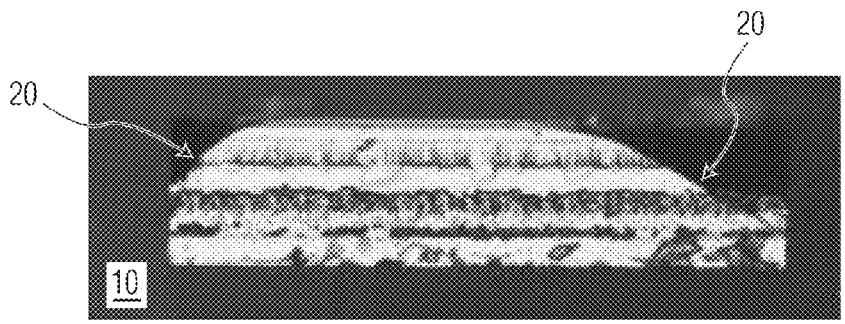
FIGS. 2A-2B illustrate the device die edge cracking as a result of the stresses shown in FIG. 1.
Figure 2B:
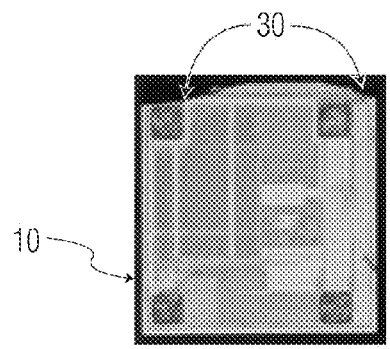

However, with the "stealth dicing" process, there is a possibility of excessive die stress after the device die is packaged into an RFID tag. The die may crack along areas modified by the laser, resulting in reliability issues with the RFID tag to outright failure. Refer to FIG. 1. An assembled device die 25 in an RFID tag 35 is subjected to stress exerted by blades 15 and roller 17, not unlike forces a user's tag would encounter by being placed in a back pocket of his trousers. Refer to FIGS. 2A-2B. An example device die 10 (in a side-view) shows the cracking 20 along the edges. The same example device die 10 (in a top-view) shows cracking 30 along some edges.

More details of "stealth dicing" may be found in U.S. patent application Ser. No. 13/687,110) of Sascha Moeller and Martin Lapke titled, "Wafer Separation" filed on Nov. 28, 2012 and is incorporated by reference in its entirety.

Further information on "stealth dicing" and "laser ablation" may be found in the product brochure titled, "Laser Application" of DISCO Corporation, Tokyo, Japan. One particular type of cutting is a HASEN Cut. The HASEN Cut is a technique that cuts while repetitively turning the laser on and off at a predetermined cycle during laser processing. By adjusting the on/off setting various die shapes may be defined. The HASEN cut may permit the processing of a wafer with combinations of irregular die shapes that cannot be realized with laser full cut processing or sawing. The cutting method can efficiently process device die having polygon shaped die, such as hexagons and octagons. Further, the technique can support multi-product wafer substrates having varied device die and their differing dimensions and shapes.

In an example embodiment, the potential for die cracking in RFID tags owing to die stress is reduced by defining an additional modification zone in particular areas on backside surfaces of device die.

Figure 3:
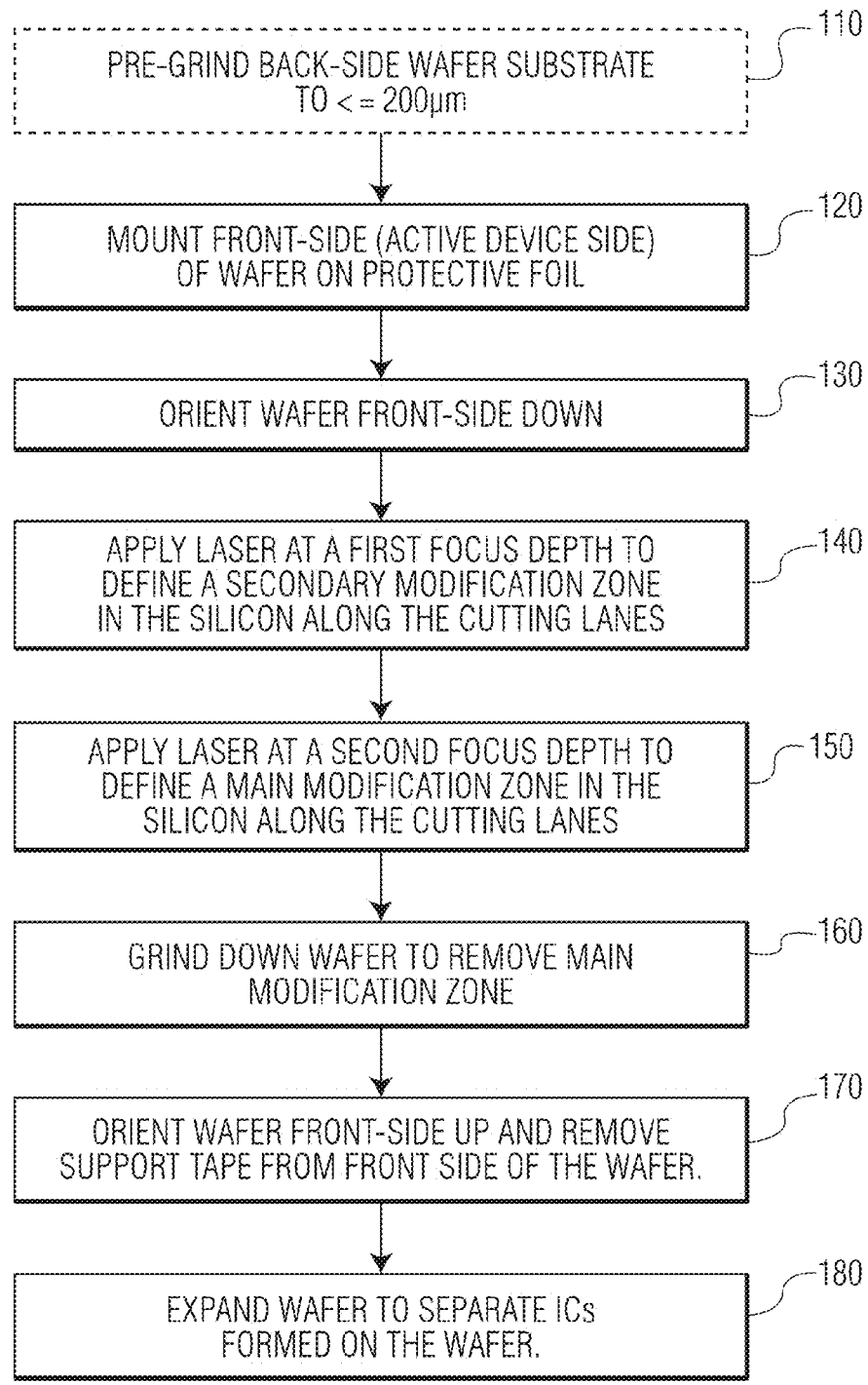
FIG. 3 is a flow diagram of an example process for preparing wafers with a main and secondary modification zone.

Refer to FIG. 3. In an example process, a wafer substrate having active device die on the front-side, undergoes a pre-back-grinding 110. For example, a pre-grinding thickness, of an eight-inch wafer (200 mm) is about 725 μm, for a six-inch wafer (150 mm) is about 675 μm. Note that this technique may be applied to wafer substrates of any size and may be useful for twelve-inch (300 mm) substrates. In an example process, a wafer is ground to a thickness of about 200 μm. It is desirable to achieve a minimum wafer thickness; however, it is limited by the technical ability to thin down wafers with 200 μm bumps. Thickness, in an example process may be in the range of about 150 μm to about 250 μm. The front-side of back-ground wafer substrate is mounted onto a protective foil 120. The now-protected wafer substrate is oriented so that the back-side surface is exposed to the dicing laser 130. The laser is applied to the back-side of the wafer at a first focus depth to define a secondary modification zone 140. Through infra-red or other imaging techniques, the position of the cutting lanes (i.e., saw lanes) is determined prior to cutting. At a second focus depth, secondary modification zones are defined in the regions in which the main modification zones had been defined 150. The main modification zones are positioned closer to the wafer back side than that of the secondary modification zone. The secondary modification zones are defined by repetitively switching the laser beam on and off at a set cycle, as the secondary modification zone is cut (i.e., HASEN cut). The distance between the main modification zones and the active area is increased by one or more secondary modification zones. The wafer substrate is further back-ground to remove the main modification zone 160. The wafer is re-oriented front-side up so that the support tape may be removed 170. The wafer is expanded to separate out the ICs that will be embedded into the RFID tag 180.

Figure 4A:
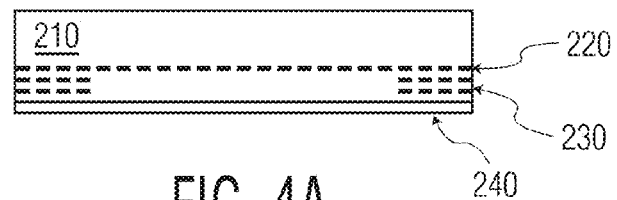
FIGS. 4A-4C are side-views of a device die with the secondary modification zones located about the edge of the active device, according to an example embodiment.
Figure 4B:
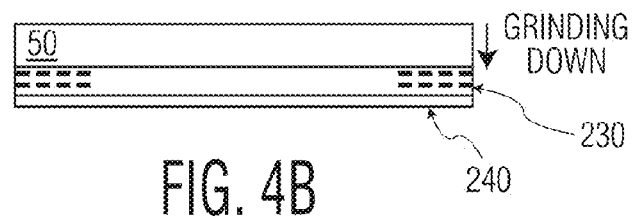
Figure 4C:
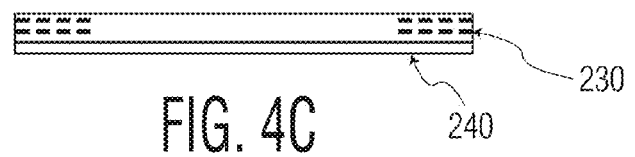

Refer to FIGS. 4A-4C. In an example embodiment, wafer substrate 210 has a main modification zone 220 and a secondary modification zone 230 defined in the saw lanes of the device die. The secondary modification zone 230 is defined at, or near active device die boundary corners. Front-side 240 is protected by a protective film (not illustrated). With a back-grinding apparatus 50, the main modification zone 220 is ground down, leaving only the secondary modification zone 230. The wafer substrate 210 with the main modification zone 220 removed are separated into individual IC device die. These IC device die are less susceptible to package-induced stress. The modification zones are determined by the focus depth of the laser beam. In general the order is not fixed, although in an example embodiment, the first the secondary (deeper) modification zone is defined and then the main modification zone is defined, thereafter.

Figure 5A:
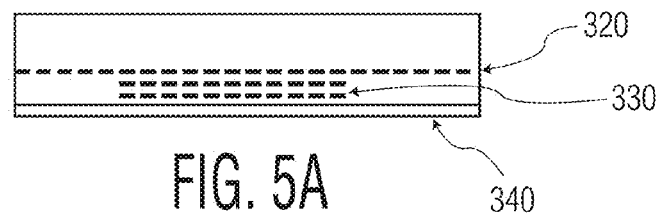
FIGS. 5A-5C are side-views of a device die with the secondary modification zone located about a center region of the active device, according to an example embodiment.
Figure 5B:
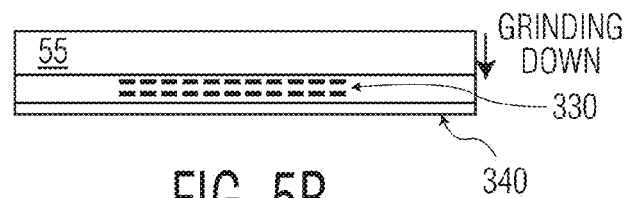
Figure 5C:

Refer to FIGS. 5A-5C. In another embodiment, wafer substrate 310, has a main modification zone 320 and a secondary modification zone 330. The secondary modification zone 330 is defined at, or near the center of the active device die boundary. In one embodiment, the secondary modification zones covers about one-third to about two-thirds of the active device area.

Figure 6A:
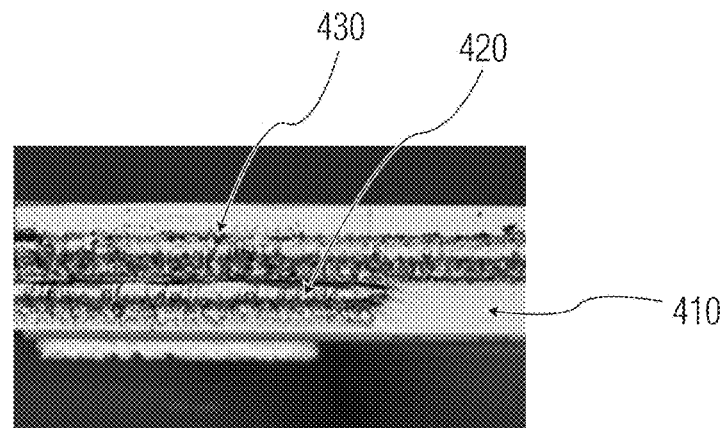
FIGS. 6A-6B are side views of a device die with the modification zones before and after back-grinding.
Figure 6B:
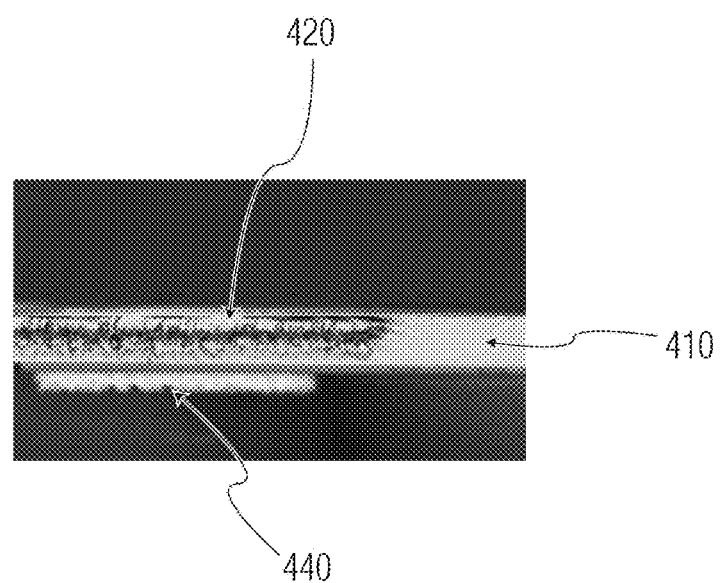

Refer to FIG. 6A. In an example embodiment, from a wafer substrate, a device die 410 covered with a top metal 440 is depicted with the main modification zone 430 and the secondary modification zone 420. In FIG. 6B the main modification zone 430 has been ground off leaving only the secondary modification zone 420. The weakening modification zones are minimized leaving only small secondary modification zones in die corners or in the die center.

Numerous other embodiments of the invention will be apparent to persons skilled in the art without departing from the spirit and scope of the invention as defined in the appended claims.

The invention claimed is:

1. An integrated circuit (IC) wafer substrate having a front-side and a back-side, the IC wafer substrate comprising:
   active devices on the front-side, each having active device boundaries, the active device boundaries defining an active device area;

a plurality of secondary modification zones on the back-side of the wafer substrate, at a first focus depth and a second focus depth into the back-side, in saw lanes between active devices;

a main modification zone on the back-side of the wafer substrate, at a third focus depth into the back-side that is shallower than that of the first and second focus depths; and wherein the secondary modification zones are located within the active device boundaries and configured to extend along less of the saw lanes and closer to the active devices relative to the main modification zone.

2. The integrated circuit (IC) wafer substrate as recited in claim 1, wherein the location of the secondary modification zones are about in corners of the active device boundaries at intersections of the saw lanes, or about center of the active device boundaries and offset from the intersections of the saw lanes, wherein the main modification zone includes a single layer of silicon having a poly-crystalline structure formed using laser ablation.

3. The integrated circuit (IC) wafer substrate as recited in claim 2, wherein the secondary modification zones cover about one-third to about two-thirds of the active device area in the saw lane and are formed using a laser beam that is switched on and off at a set cycle.

4. An apparatus comprising:
an integrated circuit (IC) wafer substrate having a front-side and a back-side, the back-side having a first crystallinity:
active devices in the front-side; and
saw lanes between the active devices and extending from the front-side to the back-side, the saw lanes defining boundaries between the active devices, each saw lane having
a first modification zone in the back-side of the wafer substrate and extending to a first depth into the back-side, and
a plurality of second modification zones in the back-side of the wafer substrate and at different depths that are deeper than the first depth, the second modification zones extending along about one-third to about two-thirds of the length of the saw lane and being closer to the active devices relative to the first modification zone,
wherein the first modification zone and the second modification zones exhibit a second modified crystallinity that is different than the first crystallinity.

5. The apparatus of claim 4, wherein the front-side is an active layer encompassing the active devices, and wherein the second modification zones extend from the active layer to the first modification zone.

6. The apparatus of claim 5, wherein the first modification zone extends along about the entire length of each saw lane.

7. The apparatus of claim 4, wherein the first modification zone extends along about the entire length of each saw lane.

8. The apparatus of claim 4, wherein the saw lanes include portions of material of the first crystallinity, and wherein the second modification zones include respective portions laterally between respective portions of the material of the first crystallinity in the saw lanes.

9. The apparatus of claim 4, wherein second modification zones include respective portions located at intersections of the saw lanes, wherein the saw lanes include material of the first crystallinity laterally between the respective portions of the second modification zones.

10. The apparatus of claim 4, wherein intersections of the saw lanes include portions of material of the first crystallinity, and wherein the second modification zones include respective portions laterally between the respective portions of the material of the first crystallinity at the intersections.

11. The apparatus of claim 4, further including cracks along the saw lanes and extending through the entire substrate, the cracks separating individual dies from the IC wafer substrate and being defined by sidewalls of the dies.

12. The apparatus of claim 4, wherein the first crystallinity is monocrystalline, and the second modified crystallinity is polycrystalline.

13. The apparatus of claim 12, wherein material in the substrate of the first crystallinity is monocrystalline silicon, and material in the substrate of the second modified crystallinity is polycrystalline silicon, the polycrystalline silicon including portions of the monocrystalline silicon that have been modified by a laser.

14. The apparatus of claim 4, further including:
cracks along the saw lanes and extending through the entire substrate, the cracks separating individual dies from the IC wafer substrate and being defined by sidewalls of the dies, and
a stretchable material in an unstretched state, the substrate being adhered to the stretchable material.

15. The apparatus of claim 4, further including:
cracks along the saw lanes and extending through the entire substrate, the cracks separating individual dies from the IC wafer substrate and being defined by sidewalls of the dies, and
a stretchable material in a stretched state, the substrate being adhered to the stretchable material and the individual dies being spaced from one another and held in place via the stretchable material.

* * * * *